United States Patent
Blott et al.

(10) Patent No.: US 9,519,486 B1
(45) Date of Patent: Dec. 13, 2016

(54) METHOD OF AND DEVICE FOR PROCESSING DATA USING A PIPELINE OF PROCESSING BLOCKS

(71) Applicant: Xilinx, Inc., San Jose, CA (US)

(72) Inventors: Michaela Blott, County Dublin (IE); Thomas B. English, County Dublin (IE); Kornelis A. Vissers, Sunnyvale, CA (US)

(73) Assignee: XILINX, INC., San Jose, CA (US)

(*) Notice: Subject to any disclaimer, the term of this patent is extended or adjusted under 35 U.S.C. 154(b) by 824 days.

(21) Appl. No.: 13/683,720

(22) Filed: Nov. 21, 2012

(51) Int. Cl.
 *G06F 13/00* (2006.01)
 *G06F 9/38* (2006.01)
 *G06F 15/78* (2006.01)
 *H03K 19/177* (2006.01)

(52) U.S. Cl.
 CPC ........... *G06F 9/3867* (2013.01); *G06F 9/3897* (2013.01); *G06F 15/7867* (2013.01); *G06F 15/7878* (2013.01); *H03K 19/17752* (2013.01); *H03K 19/17756* (2013.01)

(58) Field of Classification Search
 None
 See application file for complete search history.

(56) References Cited

U.S. PATENT DOCUMENTS

| | | | |
|---|---|---|---|
| 5,778,250 A * | 7/1998 | Dye | G06F 9/3004 712/32 |
| 5,809,552 A * | 9/1998 | Kuroiwa | G06F 13/1615 710/107 |
| 5,930,492 A * | 7/1999 | Lynch | G06F 9/30167 712/215 |
| 5,964,866 A * | 10/1999 | Durham | G06F 9/3869 708/521 |
| 6,128,720 A * | 10/2000 | Pechanek et al. | 712/20 |
| 6,272,616 B1 * | 8/2001 | Fernando et al. | 712/20 |
| 6,412,061 B1 * | 6/2002 | Dye | G06F 9/3004 326/93 |
| 6,449,708 B2 * | 9/2002 | Dewhurst | G06F 11/0721 712/15 |
| 6,883,084 B1 * | 4/2005 | Donohoe | 712/1 |
| 7,069,376 B2 * | 6/2006 | Mathewson | G06F 9/3867 710/104 |
| 7,542,041 B2 * | 6/2009 | Dutta | G06F 15/7867 345/506 |
| 8,250,339 B2 * | 8/2012 | Master | G06F 7/57 712/15 |

(Continued)

OTHER PUBLICATIONS

IBM Technical Disclosure Bulletin NA9112102 'Dynamic Pipeline Skip Stage Unit,' Dec. 1991.*

(Continued)

*Primary Examiner* — Steven Snyder
(74) *Attorney, Agent, or Firm* — John J. King; Robert M. Brush (57) ABSTRACT

A method of processing data in an integrated circuit is described. The method comprises establishing a pipeline of processing blocks, wherein each processing block has a different function; coupling a data packet having data and meta-data to an input of the pipeline of processing blocks; and processing the data of the data packet using predetermined processing blocks based upon the meta-data. A device for processing data in an integrated circuit is also described.

11 Claims, 9 Drawing Sheets

(56) References Cited

U.S. PATENT DOCUMENTS

| | | | |
|---|---|---|---|
| 8,880,849 B2* | 11/2014 | Master | G06F 7/57 712/15 |
| 2005/0040850 A1* | 2/2005 | Schultz et al. | 326/41 |
| 2008/0059764 A1* | 3/2008 | Stefan | G06F 9/3001 712/28 |
| 2008/0098203 A1* | 4/2008 | Master | G06F 7/57 712/28 |
| 2009/0128189 A1* | 5/2009 | Madurawe et al. | 326/41 |
| 2009/0285228 A1* | 11/2009 | Bagepalli et al. | 370/412 |
| 2010/0013517 A1* | 1/2010 | Manohar et al. | 326/38 |
| 2011/0276744 A1* | 11/2011 | Sengupta et al. | 711/103 |
| 2012/0221774 A1* | 8/2012 | Atkisson et al. | 711/103 |
| 2012/0317397 A1* | 12/2012 | Master | G06F 7/57 712/29 |
| 2013/0007411 A1* | 1/2013 | Asa | G06F 15/7867 712/29 |
| 2013/0275656 A1* | 10/2013 | Talagala et al. | 711/103 |
| 2014/0055496 A1* | 2/2014 | Cunningham et al. | 345/660 |

OTHER PUBLICATIONS

Berezecki, M. et al., "Many-Core Key-Value Store", Green Computing Conference and Workshops (IGCC), 2011 International, pp. 1-8, Jul. 25-28, 2011.

Berezecki, M. et al., "Power and Performance Evaluation of Memchaced on the TILEPro64 Architecture", Sustainable Computing: Informatics and Systems, vol. 2 issue, Jun. 2012, pp. 81-90.

Hetherington, Tayler H., et al., "Characterizing and Evaluating a Key-value Store Application on Heterogeneous CPU-GPU Systems", IEEE Internatinal Symposium on Performance Analysis of Systems and Software (ISPASS), Apr. 1-3, 2012, pp. 11, New Brunswick, NJ.

\* cited by examiner

METHOD OF AND DEVICE FOR PROCESSING DATA USING A PIPELINE OF PROCESSING BLOCKS

FIELD OF THE INVENTION

One or more embodiments generally relate to integrated circuits, and more particularly to methods of and circuits for processing data.

BACKGROUND

Integrated circuits may be implemented in a device for processing data. Further, the data may be processed according to different protocols which may be proprietary protocols or public protocols which conform to data transmission standards. However, depending upon a given protocol, different hardware elements may be required. The implementation of the various hardware elements may affect the performance of the device, such as throughput, latency and power consumption, for example. Each of these performance criterion continues to be significant in the evaluation of a device. That is, circuit developers continue to improve the speed of a device while reducing the power consumed by the device.

Further, there is considerable effort to reduce the cost of implementing integrated circuits. One way of reducing the cost of implementing integrated circuits is to enable a given circuit to be used in a variety of different applications. That is, if a circuit can be programmed to operate in different configurations and implement different circuits, a more cost efficient device having integrated circuits may be achieved. One area of data processing which may benefit from circuit improvements is the implementation of a key-value store (KVS). A conventional server may use its main memory for the key-value store, and has a network adapter to interface with the clients. The central processing unit (CPU) of the server may be used to handle the transaction-level processing, reads and writes to memory, hashing, hash table maintenance and all communication-related activities. However, such an arrangement is inefficient. Accordingly, there is a need for devices which provide flexibility and therefore improve the performance of data processing while reducing power consumption.

SUMMARY

A method of processing data in an integrated circuit is described. The method comprises establishing a pipeline of processing blocks, wherein each processing block has a different function; coupling a data packet having data and meta-data to an input of the pipeline of processing blocks; and processing the data of the data packet using predetermined processing blocks based upon the meta-data.

According to an alternate embodiment, a method of processing data in an integrated circuit comprises establishing a key-value store; establishing a pipeline of processing blocks, wherein each processing block has a different function; coupling a data packet to an input of the pipeline of processing blocks; and accessing the key value store while processing data of the data packet in the pipeline of processing blocks.

A device for processing data in an integrated circuit is also disclosed. The device comprises an input configured to receive a data packet having data and meta-data; and a pipeline of processing blocks coupled to the input, wherein each processing block has a different function, and the pipeline of processing blocks processes data of the data packet using predetermined processing blocks of the pipeline based upon the meta-data.

DETAILED DESCRIPTION OF THE DRAWINGS

Figure 1:
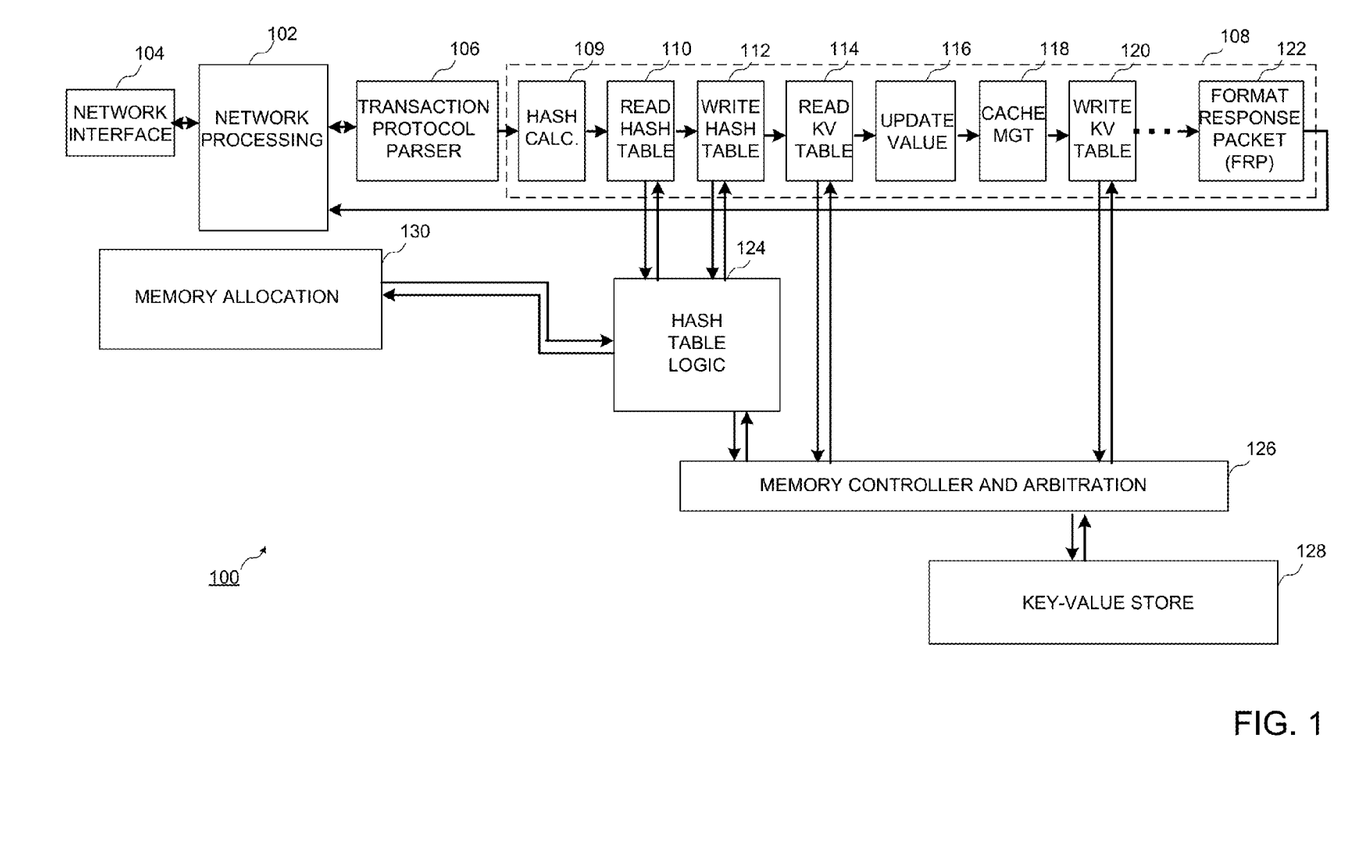
FIG. 1 is a block diagram of a circuit for processing data according to an embodiment.

Turning first to FIG. 1, a block diagram of a circuit for processing data is shown. The circuit of FIG. 1 provides a flexible dataflow-based architecture for enabling data processing in a circuit. According to one embodiment, the circuit of FIG. 1 enables the implementation of key-value stores in programmable logic or in custom integrated circuits (ICs). More particularly, it allows implementing hardware-accelerated key-value stores which achieve significantly higher throughput, lower power consumption and lower latency than conventional key-value store implementations.

According to the various embodiments, a programmable and flexible architecture can significantly increase the performance of key-value stores. The number of transactions per second which can be processed is increased, while the latency of each individual transaction and the overall power consumption are reduced. A key-value store is built around a number of key components. The first component is the key-value store itself, which is an area of memory that holds for each key a corresponding value together. One application for key-value stores is in internet technology, where key-value stores allow websites to cache their database contents in key-value stores to accelerate the performance of their websites.

According to one embodiment, the transactions on a key-value store are broken down into basic or "atomic" operations. Each atomic operation is represented by a dedicated block of programmable resources or by a more programmable micro-processor. A sequence of atomic processing blocks is arranged to form a dataflow pipeline which maintains partial order between transactions. According to the embodiment of FIG. 1, a network processing circuit 102 is coupled to a network interface 104 which receives input data. The network processing circuit 102 and network interface 104 enable transaction requests, typically via transmission control protocol/internet protocol (TCP/IP) or user datagram protocol (UDP) over Ethernet, as well as handle both the network stack and transaction processing. A transaction protocol parser 106 receives the input data by way of the network processing circuit 102 and determines which of the atomic operations in the pipeline need to be enabled for each transaction. The atomic operations which need to be enabled, which could be considered the "state" of a transaction, is then encoded as meta-data accompanying the data through the pipeline. The meta-data can also be used to convey intermediate results between the atomic processing blocks. As the transaction flows through the pipeline, the basic operations are then selectively executed or bypassed depending on the meta-data. The transaction state is also updated by a given block of the pipeline where necessary. The pipelined architecture of the embodiment of FIG. 1 is not only resource efficient, but also ensures consistency between transactions.

According to one embodiment, a pipeline of circuit blocks includes blocks to implement a key-value store. The pipeline of circuit blocks 108 according to the embodiment of FIG. 1 include a hash calculation circuit 109, a read hash table circuit 110, a write hash table circuit 112, and read key-value (KV) circuit 114, an update value circuit 116, a cache management circuit 118, a write KV table 120, and a format response packet block 122. Various circuits, such as memory or control circuits, external to the pipeline of circuit blocks 108 may also be employed. For example, a hash table logic circuit 124 is coupled to the read hash table circuit 110 and the write table hash circuit 112, and a memory controller and arbitration circuit 126, for example. The hash table logic circuit 124 and the memory controller and arbitration circuit 126 enable the implementation of the key-value store 128, as will be described in more detail below. A memory allocation block 130 is coupled to the hash logic table circuit 124. The implementation of a key-value store using the circuit blocks of the pipeline of circuit blocks 108 and other blocks outside the pipeline of circuit blocks 108 will be described in more detail below.

While a particular order of circuit blocks in the pipeline of circuit blocks 108 is shown in FIG. 1, it should be understood that the circuit blocks could be arranged in a different order, and the particular order of FIG. 1 is shown by way of example. Further, while the pipeline of circuit blocks enables the implementation enables a key-value store, the pipeline of circuit blocks could include other circuit blocks which implement a different function. That is, the use of meta-data having encoded states of a transaction could be implemented in a pipeline of circuit blocks which implement another function, where basic operations are selectively enabled or bypassed to implement the other function according to the meta-data. Although the architecture could also be implemented in an ASIC, programmable resources can offer both the flexibility and performance essential for demanding key-value store applications, as will be described in more detail below in reference to FIGS. 12-13.

Figure 5:
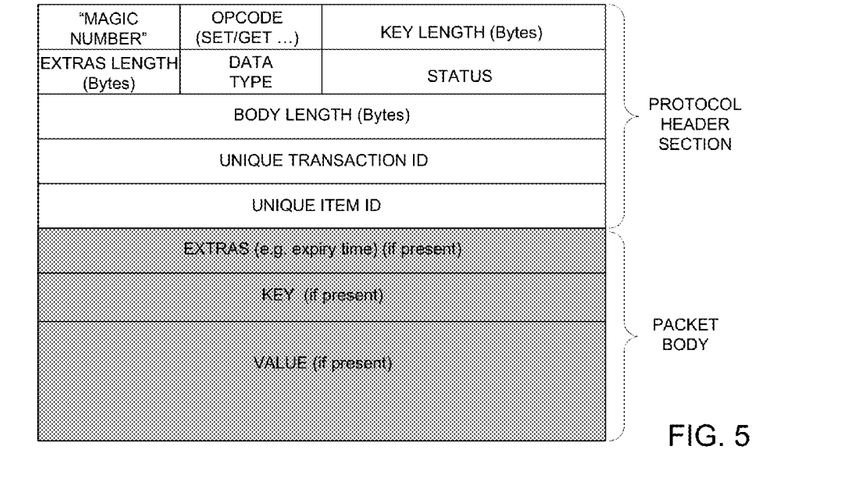
FIG. 5 is a diagram showing fields of a data packet for implementing a key-value store according to an embodiment.

The transaction state information can be communicated as a part of the header of a packet, in one of the fields as shown in FIG. 5 or in a separate header field for state information. By way of example, the transaction state could provide a listing of functions for circuit blocks of a pipeline, such as (execute hash, execute read hash, execute write hash, execute read key . . . ). Alternatively, the state information could be sent as a sub-channel with shared flow control. According to the embodiment of FIG. 2, the transaction state information could be sent as a separate sideband channel with separate flow control, where the data packet would be sent on a channel 202, and the transaction state information is sent on the side-band channel 204.

Figure 2:
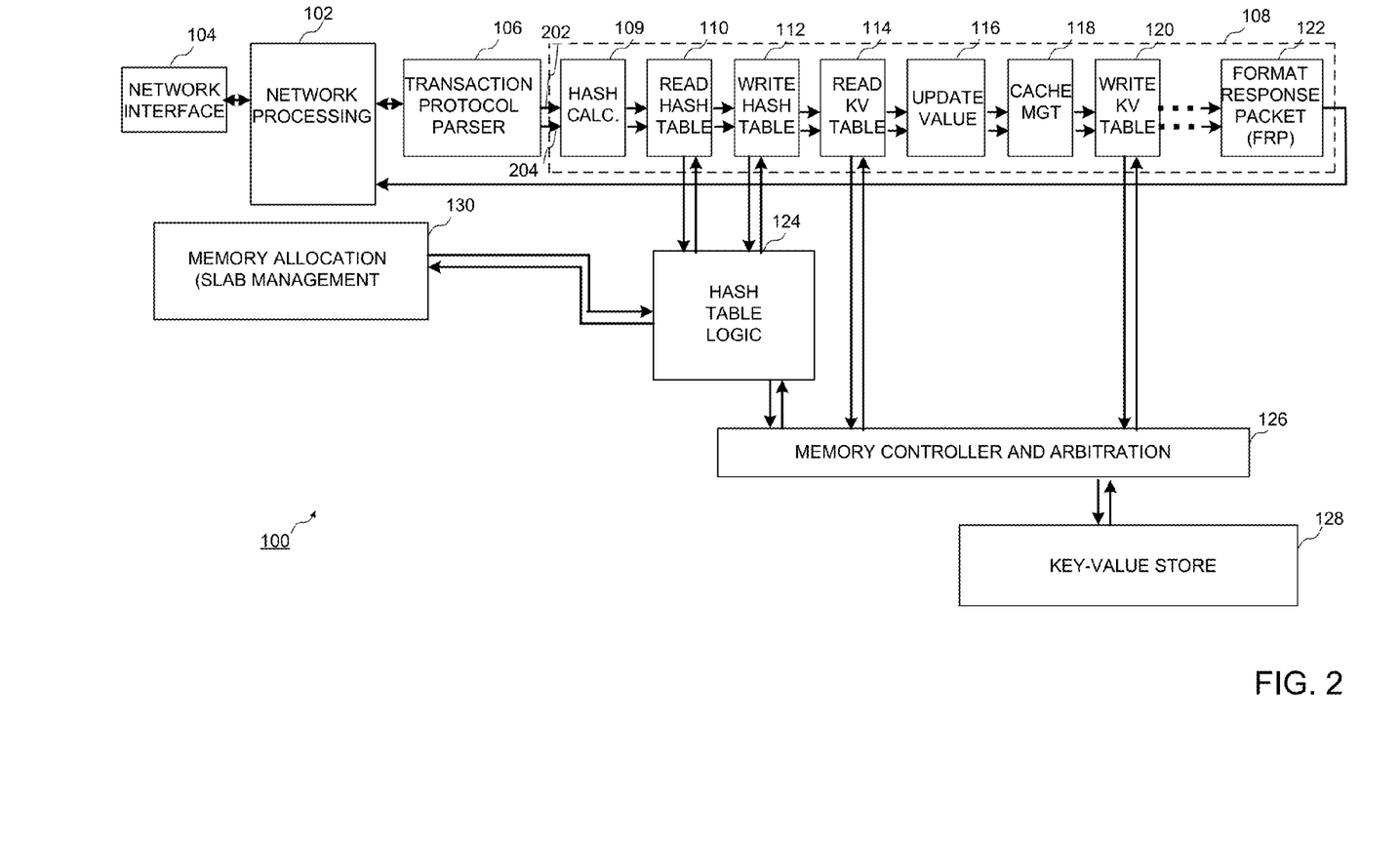
FIG. 2 is a block diagram of a circuit for processing data according to an alternate embodiment.
Figure 4:
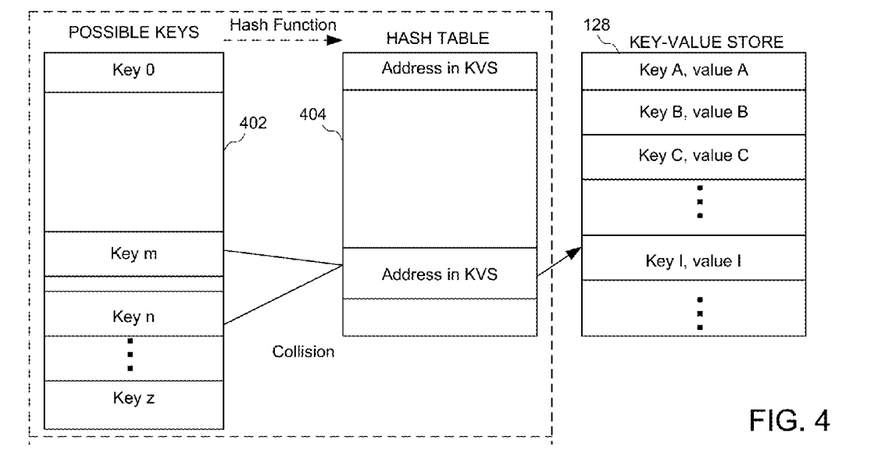
FIG. 4 are tables showing the operation of a key-value store according to an embodiment.

According to the embodiments of FIGS. 1 and 2, the hash table logic circuit 124 is utilized to avoid the need for expensive searches for items in the key-value store 128. The hash table logic circuit 124 maps a "hash" value, which is easily computed from the key, to a unique memory address within the key-value store 128. A hash function maps all possible keys 402 to an address in the associated hash table 404 as is shown in FIG. 4. The hash table then maps to an address in the actual key value store 128. Each value of the key-value store comprises a key and a corresponding value. When more than one key maps to the same entry in the hash table, a "collision" occurs. The collision can be handled according to conventional collision avoidance techniques. Alternatively, the key could be stored in the hash table together with an address to the value which resides in the key-value store, which would be functioning as just a value store. Accordingly, the key-value store could be implemented using a hash table storing the keys and a memory storing the values associated with the keys.

In operation, the circuit of FIGS. 1 and 2 receives incoming requests through a network interface 104. Basic network protocols are then processed in the network processing block 102. Typically this would include a media access control (MAC) block, followed by UDP and TCP processing. Packets generated by the networking processing block are then passed to the transaction protocol parser 106 which determines which of the atomic operations need to be activated as the packet flows through the processing pipeline. The processing blocks which need to be activated, which may be considered a processing transaction state, is then passed together with the packet through the pipeline. This could be in many forms, such as a side-band channel, a sub-channel, or a prepend to the packet. Each stage in the processing pipeline then examines relevant state bits to decide what processing (if any) to perform on a packet before passing it onto the next stage.

The actual key-value store, which resides in memory (e.g. a dynamic random access memory (DRAM)), is controlled by a memory controller and arbitration circuit 126 which also handles access arbitration. While the hash table logic circuit 124 forms a separate functional block and is coupled with a memory allocation block, a hash table itself of the hash table logic circuit 124 can be co-located with the key-value store or, alternatively, can reside in a separate memory. As set forth above, the processing pipeline contains blocks for calculating the hash function, for reading from or writing to the hash table, reading from or writing to the key-value store, modifying the values, formatting response packets and other necessary atomic operations. Accordingly, the processing pipeline effectively implements the superset of all atomic operations that are part of the key-value store transaction protocol. If the fixed execution order of the atomic operations is inconsistent with the one as dictated by the key-value store operation, then these atomic operations can be duplicated in the pipe, or alternatively carefully selected loops can be introduced. Also, it needs to be noted that these atomic operations can be implemented in many different ways including through programmable resources, dedicated hardware blocks or through conventional microprocessors.

Figure 3:
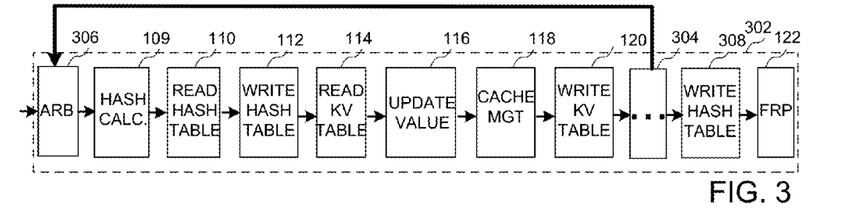
FIG. 3 is a block diagram of a pipeline of circuit blocks according to an alternate embodiment.

As shown in the embodiment of FIG. 3, if the fixed execution order of the atomic operations is inconsistent with the one as dictated by the key-value store operation, then these atomic operations can be duplicated in the pipeline. This is shown in block 308 which duplicates block 112 implementing an additional opportunity to write the hash table. Alternatively, carefully selected loops can be introduced. As shown in the pipeline arrangement of FIG. 3, additional functions may be implemented in a block 304, the output of which may be fed back to an additional arbitration block 306 which is introduced to merge multiple data streams. Accordingly, a pipeline arrangement can be implemented as required to perform a certain function, where the use of state information will indicate which blocks of the pipeline should be utilized, and in the required order. While the various blocks of the pipeline can be implemented through dedicated hardware blocks, the pipelines of FIGS. 1-3 may be implemented fully or in part in programmable resources of an integrated circuit.

Turning now to FIG. 5, a diagram shows fields of a data packet for implementing a key-value store according to one memcached protocol. The data packet comprises a protocol header section and a packet body. The protocol header section has various fields including a Magic Number field, an Opcode field, a key length field, an extras length field, a data type field, a status field, a body length field, a unique transaction ID, and a unique item ID. The packet body may include an Extras field, a key and a value.

Figure 6:
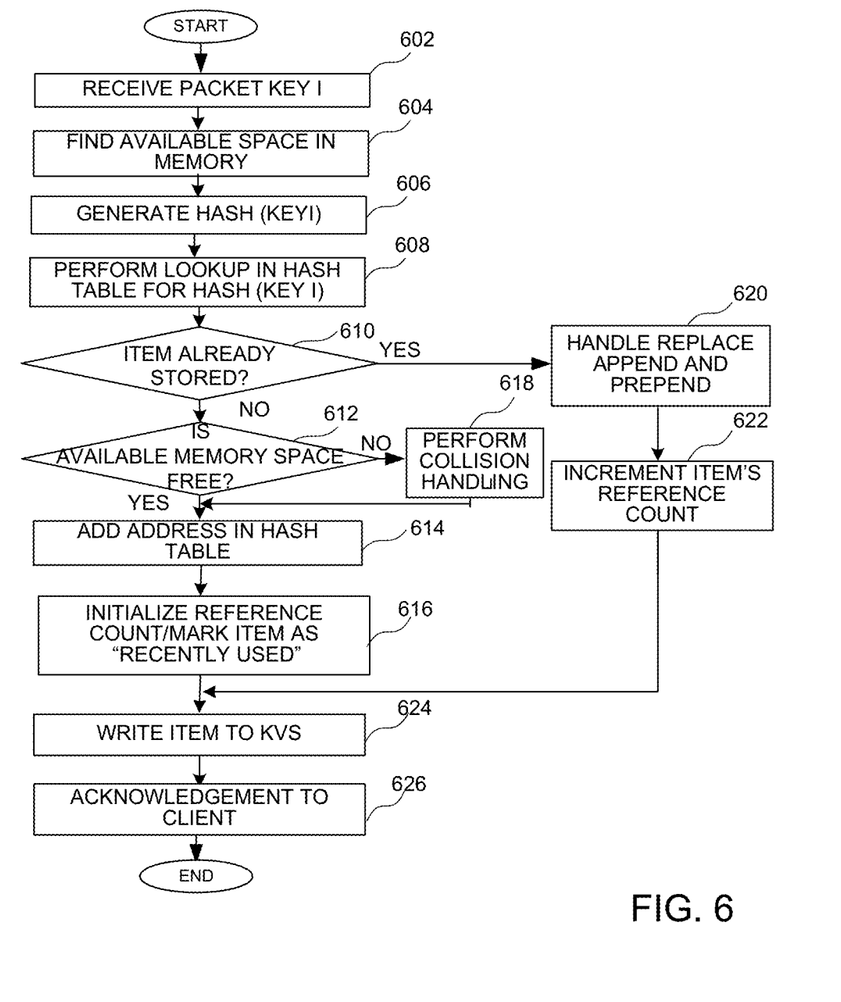
FIG. 6 is a flow chart showing the operation of a set operation when implementing a key-value store according to an embodiment.

Turning now to FIG. 6, a flow chart shows the set operation when implementing a key-value store. A command to provide data to the key value store, such as a set/add/replace/append/prepend command may be performed. In particular, a packet key I is received at a block 602, available space is identified in the key-value store at a block 604. Flowcharts enabling the finding of available memory space in memory are provided in FIGS. 8 and 9, which show the allocation of memory space. A hash (key I) value is generated at a step 606, and a lookup in the hash table for hash (key I) is performed at a step 608. It is then determined whether an item is already stored at the block 610. If not, it is determined whether the available memory space is free at a block 612. If the space is free, the address is added in the hash table at a block 614, and the reference count is initialized and the item is marked as "recently used" at a block 616. Otherwise, collision handling is performed at the block 618 before the address is added in the hash table.

If the item is already stored at the block 610, an update is handled at a block 620, and the item's reference count is incremented at a block 622. The item is then written to the key-value store at a block 624, and an acknowledgement is then sent to the client at a block 626.

Figure 7:
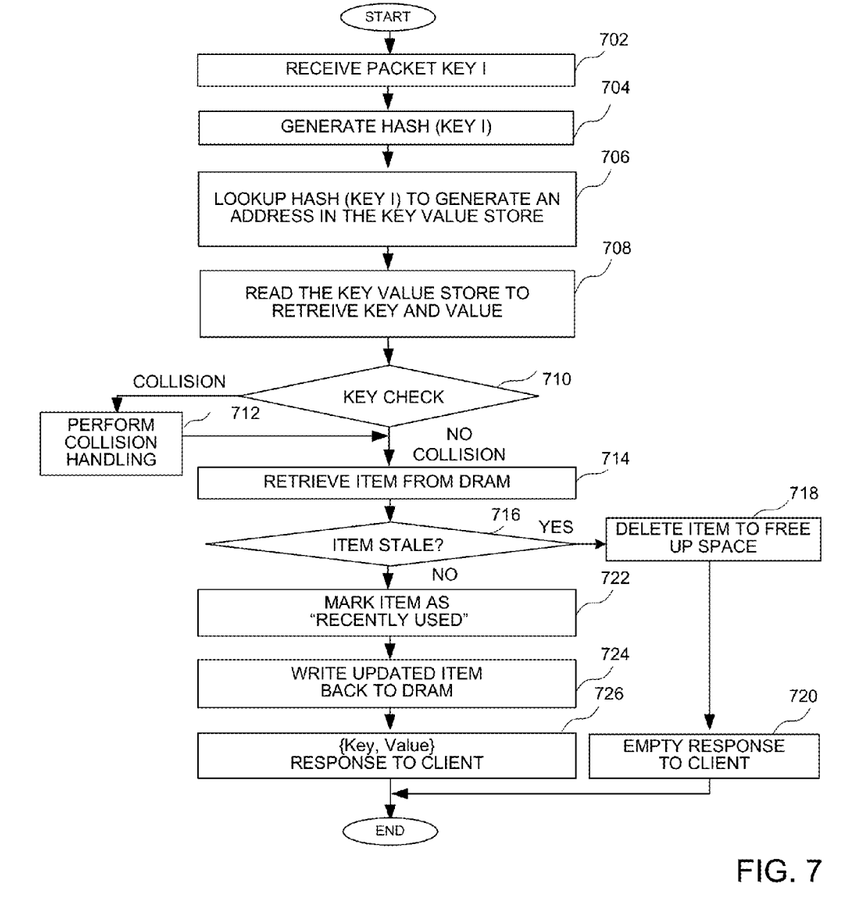
FIG. 7 is a flow chart showing a "get" operation according to an embodiment.

Turning now to FIG. 7, a flow chart shows a "get" operation to retrieve a value for a given key. For a "get" operation, a packet is first received, parsed and the key is extracted. Then a hash function over the key is computed and the value is then used as address on the hash table. The hash table returns the address of the item within the actual key-value store, from which both the stored key and the value are retrieved. The key has to be matched against the key in the packet to ensure no collision has occurred. If they are identical, the value is returned in the response packet. Otherwise, an error is returned or a collision handling mechanism takes place.

More particularly, a packet key I is received at a block 702. A hash (key I) is generated at a block 704. A lookup of the hash (key I) is then performed to generate an address in the key-value store at a block 706. The key-value store is then read to generate the key and the value at a block 708. A key check is then performed at a block 710. If a collision is detected, collision handling is performed at a block 712.

An item is retrieved from a DRAM at a block 714. It is then determined whether the item is stale at a block 716. An item can be determined to be stale based upon an "expiry time". If the item is stale, the item is deleted to free up space at a block 718, and an empty response is provided to the client at a block 720. If the item is not stale, the item is marked as "recently used" at a block 722. An updated item is then written back to the DRAM at a block 724, and a response including a key and a value is provided to the client at a block 726.

Figure 8:
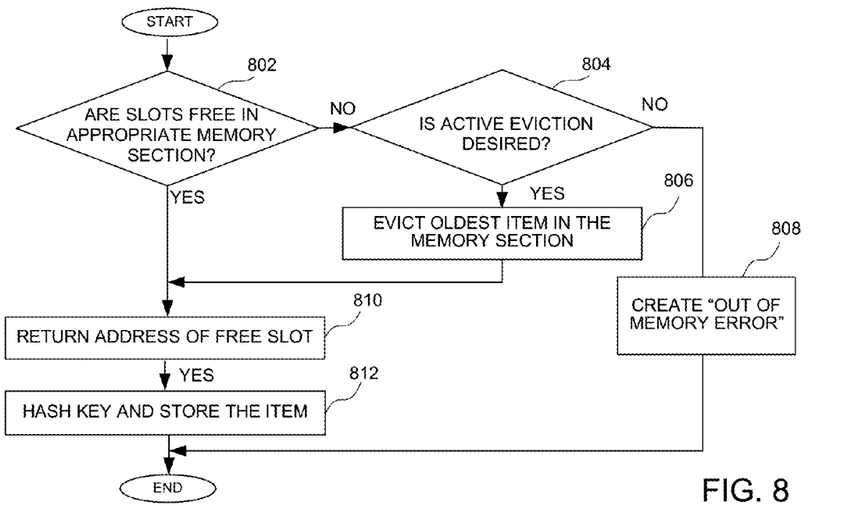
FIG. 8 is a flow chart showing a memory allocation according to an embodiment.

Turning now to FIG. 8, a flow chart shows a memory allocation. In particular, it is then determined if there are free slots in the appropriate memory section at a block 802. If not, it is determined whether an active eviction is required at a step 804. If so, the oldest item in the memory section is evicted at a block 806. If not, an "out of memory error" is created at a block 808. Otherwise, the address of the free slot is returned at the block 810, and the key is generated an the item is stored at the block 812.

Figure 9:
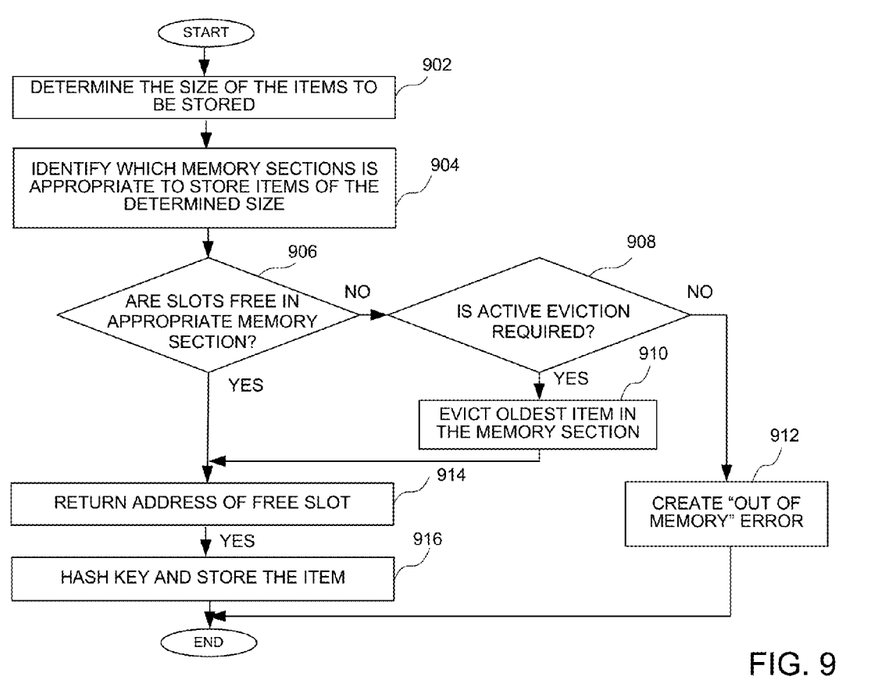
FIG. 9 is a flow chart showing a memory allocation according to an alternate embodiment is shown.

Turning now to FIG. 9, a flow chart shows a memory allocation according to an alternate embodiment which supports flexible value sizes. In particular, the size of the items to be stored is determined at a block 902. Memory sections which are appropriate to store items of the determined size are identified at a block 904. It is then determined if there are free slots in the appropriate memory section at a block 906. If not, it is determined whether an active eviction is required at a block 908. If so, the oldest item in the memory section is evicted at a block 910. Otherwise, an out of memory error is created at a block 912. If there are free slots in the memory at the block 906 or another item has been successfully evicted, then the address of the free slot is returned at the block 914, and the key is generated an the item is stored at the block 916.

Figure 10:
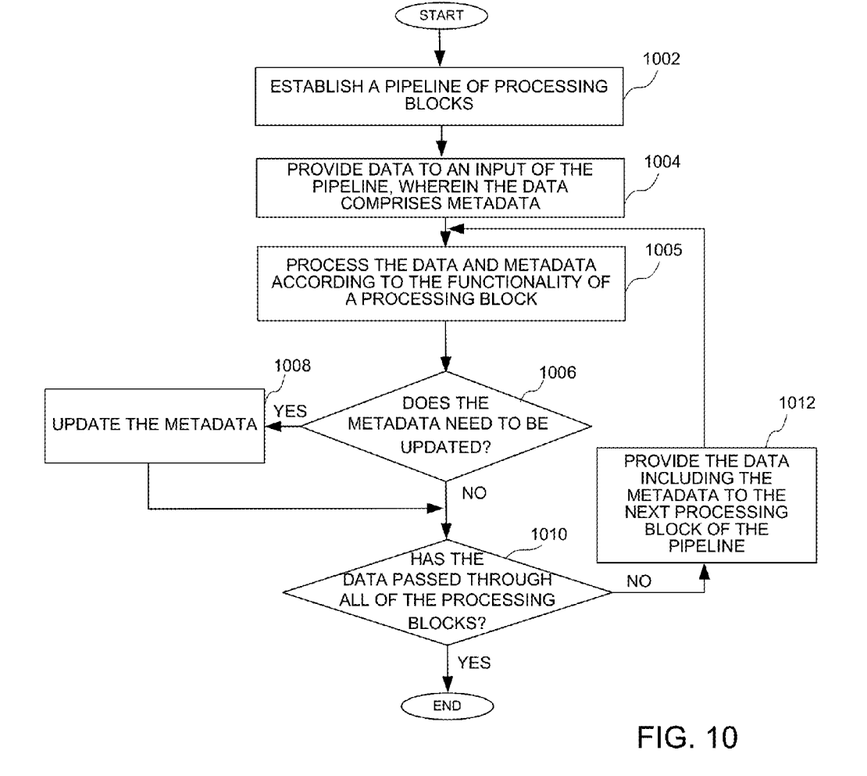
FIG. 10 is a flow chart showing a method of processing data in an integrated circuit according to an embodiment.

Turning now to FIG. 10, a flow chart shows a method of processing data and meta-data in an integrated circuit. In particular, a pipeline of processing blocks is established at a block 1002. Data is provided to an input of the pipeline at a block 1004, wherein the data comprises meta-data. Data is processed according to the functionality of a first processing block at a step 1005. It is then determined whether the meta-data needs to be updated before being passed to the next processing block of the pipeline of processing blocks at a block 1006. If so, the meta-data is updated at a block 1008. It is also determined whether the data has passed through all of the processing blocks at a block 1010. The data including the meta-data is provided to the next processing block of the pipeline at a block 1012 and the processing steps are then repeated (1005, 1006, 1008, 1010, 1012)

Figure 11:
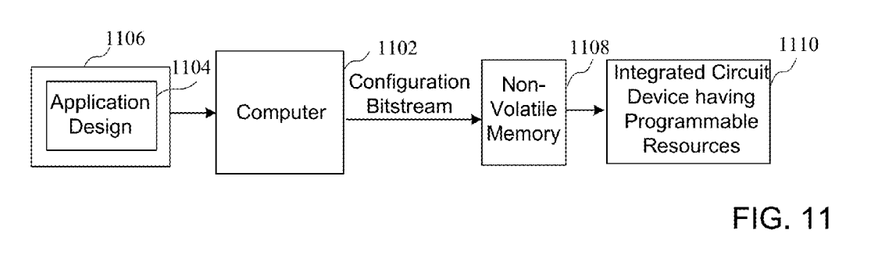
FIG. 11 is a block diagram of a system for programming an integrated circuit having programmable resources according to an embodiment.

Turning now to FIG. 11, a block diagram of a system for programming a device having programmable resources according to an embodiment is shown. In particular, a computer 1102 is coupled to receive an application design 1104 from a memory 1106, and generate a configuration bitstream which is stored in the non-volatile memory 1108. As will be described in more detail below, the circuit design may be a high level design, such as a circuit design defined in a hardware description language (HDL). Also, the computer may be configured to run software that generates a configuration bitstream which is stored in the non-volatile memory 1108 and provided to an integrated circuit 1110 which may be a programmable integrated circuit, such as the integrated circuit described below in FIG. 12.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 1202 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 12:
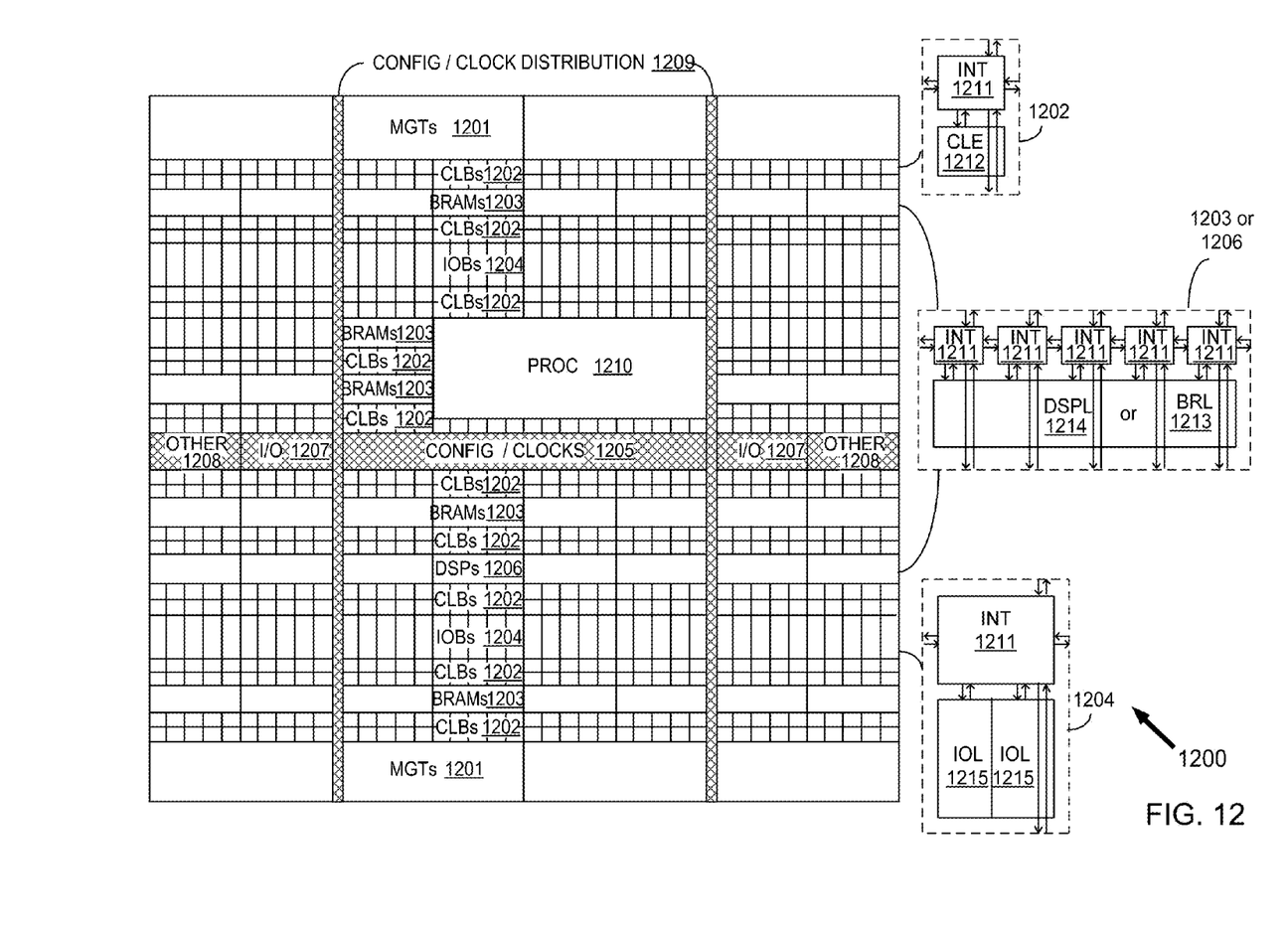
FIG. 12 is a block diagram of an integrated circuit having programmable resources.

Turning now to FIG. 12, a block diagram of an integrated circuit having programmable resources is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 12 comprises an FPGA architecture 1200 having a large number of different programmable tiles including multi-gigabit transceivers (MGTs) 1201, CLBs 1202, random access memory blocks (BRAMs) 1203, input/output blocks (IOBs) 1204, configuration and clocking logic (CONFIG/CLOCKS) 1205, digital signal processing blocks (DSPs) 1206, specialized input/output blocks (I/O) 1207 (e.g., configuration ports and clock ports), and other programmable logic 1208 such as digital clock managers, analog-to-digital converters, system monitoring logic, and so forth. Some FPGAs also include dedicated processor blocks (PROC) 1210, which may be used to implement a software application, for example.

In some FPGAs, each programmable tile includes a programmable interconnect element (INT) 1211 having standardized connections to and from a corresponding interconnect element in each adjacent tile. Therefore, the programmable interconnect elements taken together implement the programmable interconnect structure for the illustrated FPGA. The programmable interconnect element 1211 also includes the connections to and from the programmable logic element within the same tile, as shown by the examples included at the top of FIG. 12.

For example, a CLB 1202 may include a configurable logic element (CLE) 1212 that may be programmed to implement user logic plus a single programmable interconnect element 1211. A BRAM 1203 may include a BRAM logic element (BRL) 1213 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1206 may include a DSP logic element (DSPL) 1214 in addition to an appropriate number of programmable interconnect elements. An 10B 1204 may include, for example, two instances of an input/output logic element (IOL) 1215 in addition to one instance of the programmable interconnect element 1211. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1209 extending from this column are used to distribute the clocks and configuration signals across the breadth of the FPGA. Some FPGAs utilizing the architecture illustrated in FIG. 112 include additional logic blocks that disrupt the regular columnar structure making up a large part of the FPGA. The additional logic blocks may be programmable blocks and/or dedicated logic. For example, the processor block PROC 1210 shown in FIG. 12 spans several columns of CLBs and BRAMs.

Note that FIG. 12 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 12 are purely exemplary. For example, in an actual FPGA more than one adjacent column of CLBs is typically included wherever the CLBs appear in order to facilitate the efficient implementation of user logic. While the embodiment of FIG. 12 relates to an integrated circuit having programmable resources, it should be understood that the circuits and methods set forth in more detail below could be implemented in any type of ASIC.

In one embodiment, an MGT 1201 includes the characterized receiver and certain CLBs 1202 are configured to implement the eye-scan controller and the PRBS data checker using error indications stored in a BRAM 1203.

Figure 13:
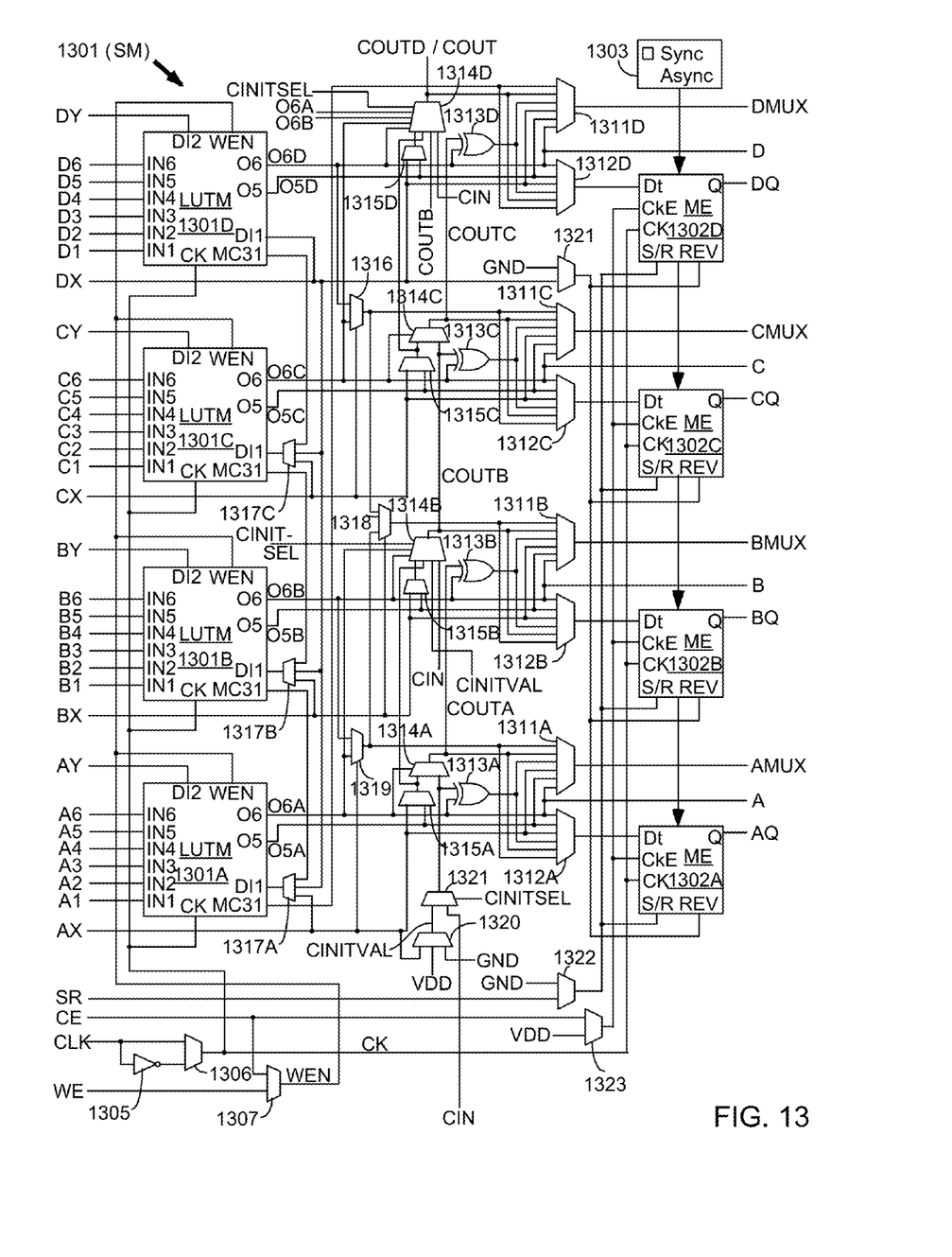
FIG. 13 is a block diagram of a configurable logic element of the integrated circuit of FIG. 12.

Turning now to FIG. 13, a block diagram of a configurable logic element of the integrated circuit of FIG. 12 is shown. In particular, FIG. 13 illustrates in simplified form a configurable logic element of a configuration logic block 1202 of FIG. 12. In the embodiment of FIG. 13, slice M 1301 includes four lookup tables (LUTMs) 1301A-1301D, each driven by six LUT data input terminals A1-A6, B1-B6, C1-C6, and D1-D6 and each providing two LUT output signals O5 and O6. The O6 output terminals from LUTs 1301A-1301D drive slice output terminals A-D, respectively. The LUT data input signals are supplied by the FPGA interconnect structure via input multiplexers, which may be implemented by programmable interconnect element 1311, and the LUT output signals are also supplied to the interconnect structure. Slice M also includes: output select multiplexers 1311A-1311D driving output terminals AMUX-DMUX; multiplexers 1312A-1312D driving the data input terminals of memory elements 1302A-1302D; combinational multiplexers 1316, 1318, and 1319; bounce multiplexer circuits 1322-1323; a circuit represented by inverter 1305 and multiplexer 1306 (which together provide an optional inversion on the input clock path); and carry logic having multiplexers 1314A-1314D, 1315A-1315D, 1320-1321 and exclusive OR gates 1313A-1313D. All of these elements are coupled together as shown in FIG. 13. Where select inputs are not shown for the multiplexers illustrated in FIG. 13, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 13 for clarity, as well as from other selected figures herein.

In the pictured embodiment, each memory element 1302A-1302D may be programmed to function as a synchronous or asynchronous flip-flop or latch. The selection between synchronous and asynchronous functionality is made for all four memory elements in a slice by programming Sync/Asynch selection circuit 1303. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1302A-1302D are clocked by a clock signal CK, which may be provided by a global clock network or by the interconnect structure, for example. Such programmable memory elements are well known in the art of FPGA design. Each memory element 1302A-1302D provides a registered output signal AQ-DQ to the interconnect structure. Because each LUT 1301A-1301D provides two output signals, O5 and O6, the LUT may be configured to function as two 5-input LUTs with five shared input signals (IN1-IN5), or as one 6-input LUT having input signals IN1-IN6.

In the embodiment of FIG. 13, each LUTM 1301A-1301D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1317A-1317C for LUTs 1301A-1301C), or to the two 32-bit RAMs via input terminals DI1 and DI2. RAM write operations in the LUT RAMs are controlled by clock signal CK from multiplexer 1306 and by write enable signal WEN from multiplexer 1307, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1301A may also be provided to the general interconnect structure for shift register chaining, via output select multiplexer 1311D and CLE output terminal DMUX. Accordingly, the circuits and methods set forth above may be implemented in a device such as the devices of FIGS. 12 and 13, or any other suitable device.

The embodiments are thought to be applicable to a variety of systems for characterizing a receiver. Other aspects and embodiments will be apparent to those skilled in the art from consideration of the specification. The embodiments may be implemented as one or more processors configured to execute software, as an application specific integrated circuit (ASIC), or as a logic on a programmable logic IC. It is intended that the specification and illustrated embodiments be considered as examples only, with a true scope and spirit of the embodiments being indicated by the following claims.

What is claimed is:

1. A method of processing data in an integrated circuit, the method comprising:
    establishing a key-value store;
    receiving data for a transaction at an input to a pipeline of processing blocks, wherein each processing block has a different function;
    encoding state of the transaction as metadata that enables a subset of the processing blocks for processing the data;
    passing the data and the metadata through the pipeline of processing blocks as a data packet having the data and the metadata; and
    accessing the key-value store while processing the data in the subset of the processing blocks based upon the metadata.

2. The method of claim 1 wherein the metadata passes through the pipeline of processing blocks in a sub-channel or a sideband channel.

3. The method of claim 1 further comprising implementing a hash table to map a hash value to a unique memory address within the key-value store.

4. The method of claim 1 wherein accessing the key-value store while processing data in the subset of the processing blocks comprises updating the key-value store.

5. The method of claim 1 further comprising parsing data of the data packet based upon a transaction protocol.

6. The method of claim 5 further comprising formatting a response packet based upon the transaction protocol.

7. A device for processing data in an integrated circuit, the device comprising:
    a network interface configured to receive data for a transaction;
    a transaction protocol parser, coupled to the network interface, configured to encode state of the transaction as metadata that enables a subset of processing blocks in a pipeline of processing blocks for processing the data and to couple the data and the metadata to the pipeline of processing blocks as a data packet having the data and the metadata;

the pipeline of processing blocks coupled to the transaction protocol parser, wherein each processing block has a different function, and wherein the subset of the processing blocks processes the data based upon the metadata;

a key-value store coupled to the pipeline of processing blocks, wherein the pipeline of processing blocks accesses the key-value store while processing the data based upon the metadata.

8. The device of claim 7 wherein the key-value store comprises a plurality of memory locations each having a key and a corresponding value.

9. The device of claim 8 further comprising a hash table coupled to the pipeline of processing blocks, the hash table mapping a hash value to a unique memory address within the key-value store.

10. The device of claim 9 wherein the pipeline of processing blocks comprises a cache management circuit to maintain the hash table.

11. The device of claim 7 wherein the pipeline of processing blocks comprises an output block configured to format a response packet based upon the transaction protocol.

* * * * *